United States Patent [19]
Bowers et al.

[11] Patent Number: 5,714,892
[45] Date of Patent: Feb. 3, 1998

[54] THREE STATE LOGIC INPUT

[75] Inventors: Derek F. Bowers, Sunnyvale; James J. Ashe, Saratoga, both of Calif.; Leo P. Mchugh, BallyKeeffe, Ireland

[73] Assignee: Analog Devices, Inc., Norwood, Mass.

[21] Appl. No.: 627,504

[22] Filed: Apr. 4, 1996

[51] Int. Cl.$^6$ .......................................... H03K 19/0175
[52] U.S. Cl. .......................... 326/60; 326/56; 326/62
[58] Field of Search ............................ 326/56–58, 60, 326/62; 341/126

[56] References Cited

U.S. PATENT DOCUMENTS

| | | | |
|---|---|---|---|
| 4,100,429 | 7/1978 | Adachi | 326/60 |
| 4,465,944 | 8/1984 | Shin | 326/60 |
| 4,804,867 | 2/1989 | Okitaka et al. | 326/58 |
| 5,045,728 | 9/1991 | Crafts | 326/60 |
| 5,194,766 | 3/1993 | Sugawara | 326/60 |
| 5,598,110 | 1/1997 | Chang | 326/60 |
| 5,631,575 | 5/1997 | Lee et al. | 326/58 X |

OTHER PUBLICATIONS

Data sheet for the MAX148 ADC available from MAXIM integrated products, Sunnyvale, California, Jan. 1996, pp. 1–20.

Paul Horowitz, Winfield Hill, *The Art of Electronics*, Cambridge University Press, New York, 1989, pp.142–143, 487–489, 614–616, 917–985.

*Primary Examiner*—David R. Hudspeth
*Attorney, Agent, or Firm*—Koppel & Jacobs

[57] ABSTRACT

A three state logic input recognizes three logic levels: an intermediate level in addition to the conventional "high" and "low" levels employed by binary logic systems. The three state device may be used in purely ternary logic systems or in "hybrid" systems which combine binary and ternary logic. In a preferred embodiment, the new three state logic device comprises a "passive driver" which is connected to produce one of three predetermined logic levels in corresponding to impedance paths from its input terminal through an external circuit to a positive or negative voltage supply. In hybrid ternary/binary applications, the new three state input device includes a decoder that is connected to decode the three predetermined logic levels provided by the passive driver into binary logic for use by associated binary logic devices. In a digital to analog converter application, the three state input device is employed to recognize both a binary logic and a control signal at one input pin to the DAC.

18 Claims, 4 Drawing Sheets

THREE STATE LOGIC INPUT

BACKGROUND OF THE INVENTION

1. Field of the Invention

The invention is related to logic input devices, in particular to three-state, or ternary, logic inputs.

2. Description of the Related Art

The logic devices which produce the memory circuits, shift registers, latches, and arithmetic logic units which comprise digital computers are based upon binary logic, which employs two states, HIGH/LOW, ON/OFF, as the basic unit of a logic system. Other logic systems, based on three-level, four level . . . n-level logic could be used. Since the information content of each digit is related to the number of levels which may be assigned to it, multilevel systems, i.e., those employing three or more levels, hold a clear advantage over binary systems with regard to information content. For example, digital audio systems frequently provide 20 bit resolution; that is, $2^{20}=1,048,576$ signal levels are encoded into twenty binary digits. A three-level, or ternary, system could encode more than 1,048,576 signal levels, e.g., $3^{13}=1,594,323$ levels, using only 13 digits.

Since information content increases rapidly with the number of signal levels a digit may represent, one might expect digital systems employing multilevel signaling schemes, rather than binary systems, to dominate. But there are a number of reasons for the popularity of binary electronic systems. Binary signaling is relatively easy to implement. For example, binary signaling may be based upon the presence or absence of a current, a high or low voltage, or the presence of a reflecting or non-reflecting surface. Binary signaling provides relatively good noise immunity and, as circuits age or are subjected to environmental variations, binary systems accommodate the consequential drift in input/output characteristics of electronic devices.

Nevertheless, the limited information content of binary digital electronics does impose undesirable performance limitations upon digital systems. One, perhaps unexpected, manifestation of binary signaling limitations may be found in the pinout limitations encountered by integrated circuit (IC) designers. Integrated circuits are generally contained in packages having standardized pinouts, such as 16 pin dual-in-line-package (16 pin DIP), pin grid arrays, etc., with costs generally proportional to the number of pins. But ICs have become so complex that it is often difficult to bring all the necessary signal ports to the outside of an IC package. Consequently, multiple signals are sometimes time-division-multiplexed onto a single pin, or internal registers are employed to store information which, after storage, may be accessed through proper addressing.

However, these solutions are not always satisfactory. Accessing information held within registers may require several steps, and some signals, such as a "reduced power" signal which is employed to reduce power consumption within a circuit, simply are not amenable to time-division multiplexing. Furthermore, it would be highly desirable to employ a single reduced power signal which links many, if not all, of the devices within a system so that a reduced power mode may be entered quickly. For a discussion of low-power design techniques which may employ a reduced power signal, including power cycling and sleep mode operation, see Paul Horowitz, Winfield Hill, *The Art of Electronics*, Second Edition, Cambridge University Press, New York, 1989 at pages 917–985.

Some digital circuits feature output stages that, in addition to driving attached circuits to either HIGH or LOW levels, also "disconnect themselves" from the attached circuit. Output stages such as these were developed in the context of bus lines, such as microprocessor address or data bus lines, which must be driven by any one of a number of attached devices. Conventional totem-pole output stages would not permit such an arrangement because each attached device would attempt to drive the line either HIGH or LOW and contention among the attached devices would result. "Open collector"output stages, which are tied to a positive supply through an external resistor, permit more than one device to drive a given line; any attached device may pull the output signal low through its output stage, which usually comprises an npn transistor or n-channel FET. Whenever the output stages are turned off, the external pullup resistor pulls the line up to a HIGH signal level.

Three state output stages also allow several devices to drive the same signal line, at different times. A three state output is, in a first order analysis, a totem pole output with an "enable". When a totem pole output driver is enabled, it will drive its output terminal to either a logic HIGH or logic LOW level. Whenever it is disabled, the three-state output is placed in a high impedance state, letting it "float"so that it may be driven by another device. Although open collector and three-state outputs permit several devices to drive the same input line, these are not three state devices in the sense that each of their output states is recognized as a logic level. For a discussion of open collector and three-state outputs see Paul Horowitz, Winfield Hill, *The Art of Electronics*, Second Edition, Cambridge University Press, New York, 1991 at pages 487–489.

SUMMARY OF THE INVENTION

The invention is directed to a logic input device that recognizes three distinct logic states, thereby reducing pinout requirements and permitting the use of ternary logic.

The invention comprises a passive driver connected to positive and negative supplies. The driver has input and output terminals, with the output terminal providing one of three predetermined logic level outputs. Each logic level output corresponds to one of three impedance paths connecting the input of the driver through an external circuit to the positive or negative supply. That is, one logic level output corresponds to the connection of a low impedance path from the input terminal through the external circuit to the negative supply, another corresponds to the connection of a low impedance path from the input terminal through the external circuit to the positive supply, and the third logic level corresponds to an "open"or high impedance path from the input terminal through the external circuit to either supply.

In a preferred embodiment the passive driver comprises a resistor divider connected in series between the positive and negative supplies, with the input and output terminals connected to a tap of the divider. The resistors are selected such that an external circuit may drive the tap to conventional high and low levels. Additionally, the resistors drive the tap to an intermediate level whenever the external circuit is placed in a high impedance state.

In a reduced power application, the three state input device includes a ternary to binary decoder connected to receive the passive driver's output and to provide binary outputs corresponding to the three logic levels available from the passive driver. The ternary-to-binary decoder includes a window detector connected to the resistor divider tap and a delay circuit connected to the output of the window detector. The window detector activates an output signal in response to the detection of an intermediate signal level at the divider tap. The delay circuit produces a control output in response to the activation, for a predetermined period of time, of the window detector output.

A buffer is connected at its logic input to the divider's tap. The buffer includes a control input which, when activated, places the buffer output in a high impedance, or "floating" state. The buffer's control input is connected to the reduced power control output of the delay circuit. Consequently, the buffer is disconnected from its power supplies whenever the delay circuit activates the reduced power signal. Additionally, the reduced power control signal is connected to the control input of a switch which connects the output terminal of the buffer to one of the supplies whenever the power-down signal is activated.

In one implementation, the above-described reduced power circuit is incorporated within a digital to analog converter (DAC). The DAC includes reference and output sections connected together through switches which operate under control of the DAC's control circuit, or controller. In response to activation of the reduced power signal, the DAC's control circuit "opens" switches which connect the reference and output sections.

These and other features, aspects and advantages of the invention will be apparent to those skilled in the art from the following detailed description, taken together with the accompanying drawings.

DETAILED DESCRIPTION OF THE INVENTION

Figure 1:
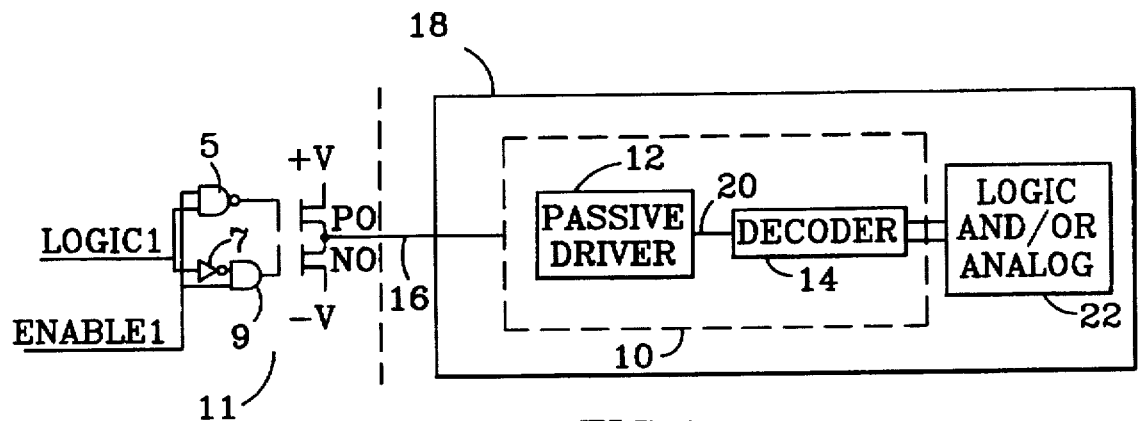
FIG. 1 is block diagram of a logic system which employs the new three state input device.

The new three state input stage 10 of FIG. 1 includes a passive driver 12 which converts conventional "three state" logic inputs, i.e., HIGH voltage, LOW voltage, and "floating", into true three level logic, i.e., HIGH voltage, LOW voltage, and an intermediate level voltage. A ternary-to-binary decoder 14 may be included for hybrid ternary/binary applications. A signal received by the input stage at an input terminal 16, which may extend beyond the boundary of an associated IC 18, is routed to the passive driver 12, where it is converted to ternary levels. In a ternary logic system, the output terminal 20 of the driver 12 is connected to other logic and/or analog circuitry 22 within the IC 18. In a hybrid ternary/binary system, the output terminal 20 is connected to the ternary-to-binary decoder 14, which provides corresponding binary output signals to the logic and/or analog circuitry 22.

A conventional three state output 11 is shown connected to the input 16 for illustrative purposes. The three state output includes logic and enable signals which appear at inputs LOGIC1 and ENABLE1, respectively. Both signals are conveyed to the inputs of a two input AND gate 9, after the logic signal is inverted by an inverter 7, and to a two input NAND gate 5. The outputs of the NAND gate 5 and AND gate 9 are connected to the gates of a p-channel FET P0 and an n-channel FET N0, respectively.

Whenever the enable signal is low, the gates 5 and 9 are disabled, that is the output from the NAND gate 5 is HIGH, turning the FET P0 off, regardless of the logic signal's input state and the output from the AND gate 9 is LOW, turning the FET N0 off, regardless of the logic signal's input state. With both FETs off, their is a high impedance path between the input 16 and the positive V+ and negative V− supply voltages. Whenever the enable signal is HIGH, the gates 5 and 9 are enabled, with a HIGH logic input turning P0 on and N0 off and a LOW logic input turning P0 off and N0 on, thereby providing the input pin 16 with a low impedance path to either the positive V+ or negative V− supply voltage.

When a conventional three state output 11 drives the signal at the input terminal 16 HIGH, the passive driver output at terminal 20 is HIGH. Similarly, when a conventional three state output drives the signal at terminal 16 LOW, the output at terminal 20 is also LOW. However, unlike conventional input stages, whenever the input pin 16 is left floating, such as when a three state output is "disabled", the passive driver 12 drives the terminal 20 to a definite intermediate voltage level. In this way, signals which conventionally are classified as HIGH, LOW and indeterminate, are converted to three known, active signal levels, i.e., HIGH, LOW and INTERMEDIATE.

Figure 2:
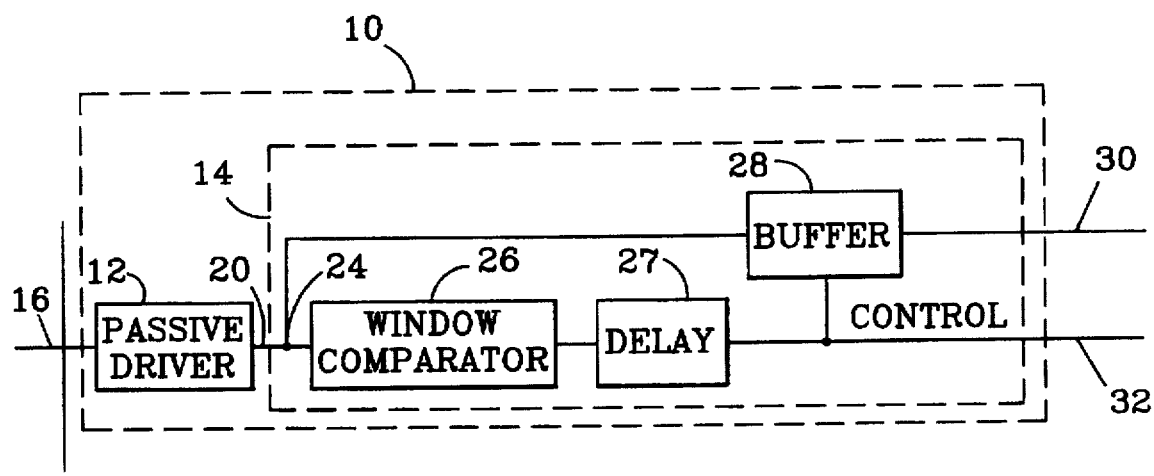
FIG. 2 is a block diagram of a preferred embodiment of the new three state input device, including a passive driver and a ternary to binary decoder.

A preferred embodiment of the new input stage, one which includes the ternary-to-binary decoder 14, is shown in the block diagram of FIG. 2. A three-level signal from the driver 12 is communicated to the decoder 14 at an input terminal 24. A window comparator 26 receives the three level signal, compares it to a predetermined intermediate voltage range and, if the signal is within that range, initiates a delay circuit 27. The three-level signal from the driver 12 is also communicated to a buffer 28 which, as will be discussed in greater detail in relation to FIG. 3, in the preferred embodiment is an inverter with a control input that, when activated, disconnects the inverter from positive and negative voltage supplies to reduce power consumption.

If a signal from the driver 12 is either HIGH or LOW, the buffer 28 simply buffers the signal, in this case by inverting it to produce a LOW or HIGH signal at its output 30. Additionally, the delay circuit produces a HIGH level at the output 32. On the other hand, if the signal from the driver 12 is at an intermediate level for a predetermined period, the delay circuit 27 produces a LOW level signal at the control output 32, which also forces the buffer output LOW. Thus, in the preferred embodiment a HIGH level input at the input pin 16 yields a LOW level signal at the output 30 and a HIGH level at the output 32, a LOW level input yields a HIGH level signal at the output 30 and a HIGH level signal at the output 32, and a "floating", or high impedance, input yields a LOW level signal at both outputs 30 and 32. In this manner, the conversion from ternary code to binary code is complete and a single input, driven by a three state output, may produce three separate binary states.

As will be discussed in greater detail in relation to FIG. 3, since any transition between HIGH and LOW levels at the input to the input stage 10 will pass through the intermediate level and drive the output 20 of the passive driver to the intermediate range recognized by the window comparator 26, the delay circuit 27 ensures that critical circuits responsive to the INTERMEDIATE level signal, e.g., a reduced power circuit, are not activated during each of these transitions.

Figure 3:
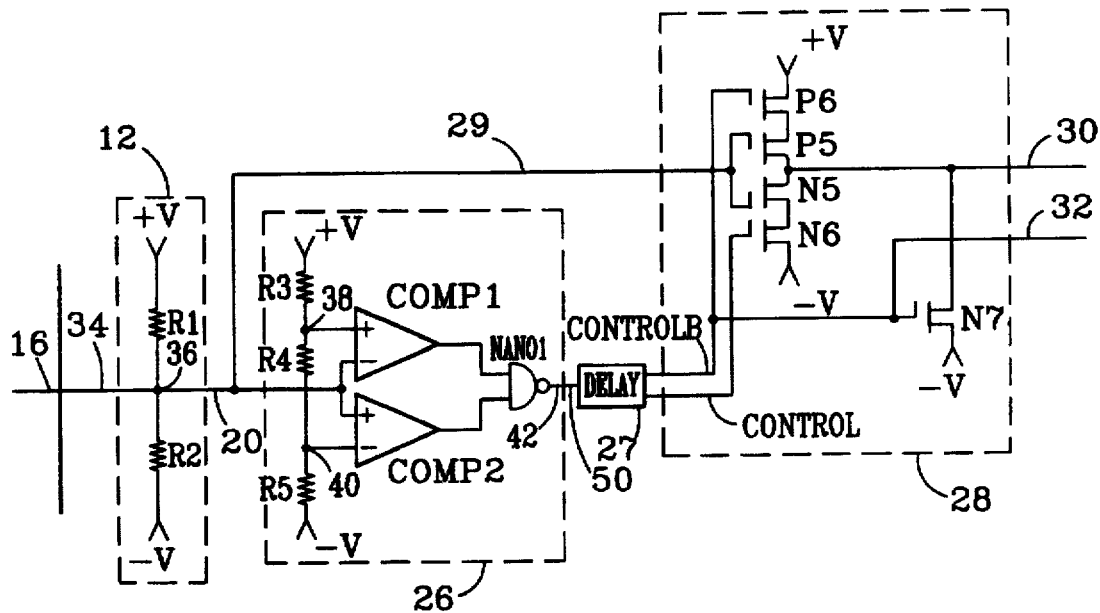
FIG. 3 is a more detailed schematic diagram of the new three state input device of FIG. 2.

As illustrated in the schematic diagram of FIG. 3, in the preferred embodiment the passive driver 12 is implemented as a resistor divider, including resistors R1 and R2 connected between positive V+ and negative V− supplies. In the preferred embodiment, the positive supply voltage V+ is 5V and the negative supply voltage V− is at ground. The driver 12 includes input and output terminals 34 and 20, respectively, connected to the tap 36 of the resistor divider. In the preferred embodiment, the resistors R1 and R2 are 680 kohm and 320 kohm resistors, respectively. The relatively high impedance values allow an external circuit to drive the tap 36 to the required logic input levels (i.e., typically 0.8V maximum LOW level and 2.4V minimum HIGH level) with relative ease. With an external driving circuit in a high impedance state, the driver 12 drives the output terminal 20 to 1.6V, midway between the maximum LOW and minimum HIGH logic levels.

The window comparator 26 includes three resistors R3, R4 and R5 connected in series between V+ and V− to provide reference voltages at taps 38 and 40 which are formed at the junctions of resistors R3 and R4, and R4 and R5, respectively. In the preferred embodiment, resistors R3, R4 and R5 are 640 kohm, 80 kohm and 280 kohm, respectively. The voltages at taps 38 and 40 are therefore 1.8V and 1.4V. Tap 38 is connected to the noninverting input of a comparator COMP1 and tap 40 is connected to the inverting input of a comparator COMP2. The inverting input of COMP1 and noninverting input of COMP2 are connected to the output 20 of the driver 12. The outputs of COMP1 and COMP2 are connected to a two-input NAND gate NAND1. Whenever the output 20 is between 1.8 V and 1.4 V, the noninverting inputs of COMP1 and COMP2 are higher than their inverting inputs; therefore both their outputs will be HIGH and the output 42 of NAND1, which also constitutes the output of the window comparator 26, will be LOW. Otherwise, one of the comparators' outputs will be LOW and the output of NAND1 will be HIGH.

Figure 4:
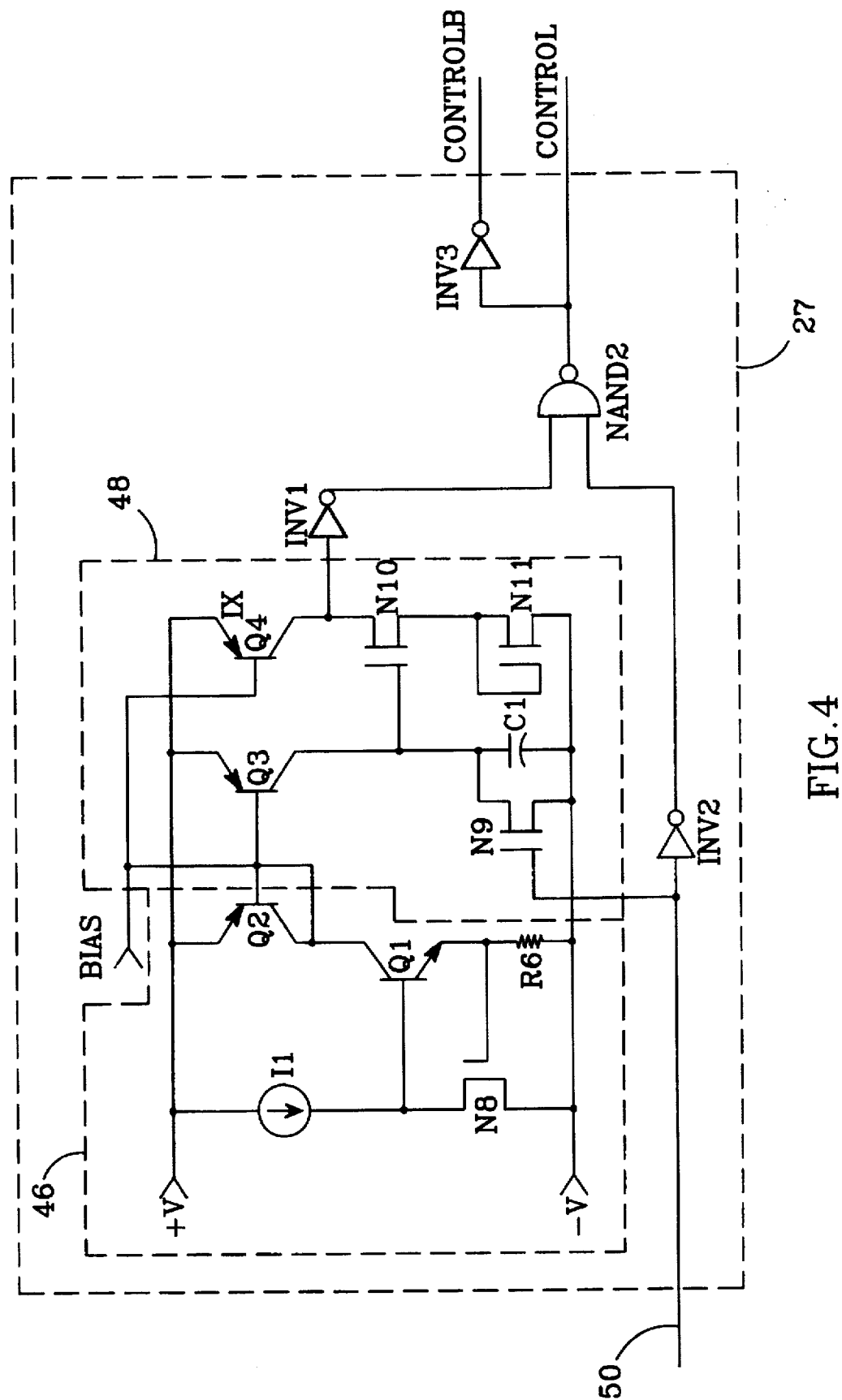
FIG. 4 is a detailed schematic of the delay circuit of FIG. 3.

The output 42 of the window comparator is connected to the delay circuit 27, which is described in greater detail in relation to FIG. 4. Whenever the output of the passive driver 20 is at the INTERMEDIATE level, i.e., 1.6V in the preferred embodiment, the input to the delay circuit 27 is LOW and the data input 29 to the buffer 28 is also at 1.6V. The buffer 28 includes a CMOS inverter composed of n-channel and p-channel FETs N5 and P5 which are connected through p-channel and n-channel FETs P6 and N6 to V+ and V−, respectively. Signals CONTROL and CONTROLB from the delay circuit 27 are connected to the gates of P6 and N6, respectively. Whenever an INTERMEDIATE level signal has been sensed at the output 20 of the driver 12 for a predetermined period of time, the delay circuit drives CONTROLB to a HIGH level, turning P6 off, and CONTROL to a LOW level, turning N6 off, thereby isolating the P5/N5 inverter from power supplies V+ and V−. The n-channel FET N6 or the p-channel FET P6 could be eliminated from this illustrative embodiment, just so long as the path from V+ to V− through the P5/N5 inverter is "opened" whenever an INTERMEDIATE level signal has been sensed at the output 20 of the driver 12 for a predetermined period of time.

Without this isolation of the inverter, current would flow from V+ to V− through the inverter because the gate, being connected to the output 20, would be at a voltage within the 1.4V to 1.8V range. With the inverter isolated in this way, an n-channel FET N7, also activated by the signal CONTROLB, pulls the output 30 (taken from the drain of P5 and the source of N5) to a LOW signal level. On the other hand, whenever an INTERMEDIATE signal level has not been sensed at the output 20 for a predetermined period, the logic levels of signals CONTROL and CONTROLB are reversed and, consequently, the inverter is connected through P6 and N6 to V+ and V− and operates as an inverting buffer. Additionally, since the n-channel FET N7 is also activated by CONTROLB, N7 will be "off" and will therefore not contend with the P5/N5 inverter to drive the output 30.

The details of one possible implementation of the delay circuit 27 are illustrated in the schematic of FIG. 4. In a first order analysis, the delay circuit is based upon a current source 46 which provides charging current for a capacitor-based time delay 48. The current source 46 includes an npn transistor Q1 connected at its emitter to a negative supply V− through a resistor R6, at its collector through a diode-connected pnp transistor Q2 to a positive supply V+, and at its base to a JFET current source I1. The base of Q1 is also connected to the drain of an n-channel FET N8 which has its gate connected to the emitter of Q1. The N8/Q1 pair form a feedback circuit which maintains the gate-to-source threshold voltage of N8 (VGS8t) across the resistor R6, a 1 Mohm resistor in the preferred embodiment. The current through Q1 and Q2, neglecting base currents, is a constant VGS8t/R6 which, due to the diode connection of Q2, is mirrored into a pnp transistor Q3 of the capacitor-based time delay circuit 48.

The emitter areas of transistors Q2 and Q3 are ratioed ten to one, so that the collector current of Q3 is VGS8t/10Mohm and this current flows, depending upon the state of a delay circuit input 50, into a capacitor C1 (20 pf in the preferred embodiment) or the source of an n-channel FET N9. The delay circuit's input 50 is connected to the output 42 of the window comparator, which is HIGH unless a signal between 1.4V and 1.5V is present at the output 20 of the driver 12. So long as the input 50 is at a HIGH level, i.e., no intermediate signal is detected by the window comparator 26, the gate of N9 is HIGH and N9 is "on". Since the drain of N9 is connected to the collector of the transistor Q3, N9 conducts the collector current from Q3 through its drain to ground. Whenever the window detector 26 detects an intermediate level signal, the signal at the delay input 50 will go LOW, turning N9 "off", and thereby routing the collector current of transistor Q3 to charge the capacitor C1.

The positive side of the capacitor C1 is connected to the gate of an n-channel FET N10 which is "stacked" on another n-channel FET N11, having threshold voltages VGS10t and VGS11t, respectively. That is, the source of the FET N10 is connected to the drain and gate of the FET N11 and the source of the FET N11 is connected to the negative supply V−. The drain of the FET N10 is connected to the input of an inverter INV1 and, through an pnp transistor Q4, to the positive supply V+. As long as the capacitor C1 is discharged, N10 and N11 remain "off" and the voltage at the input to the inverter INV1 is HIGH. When the capacitor voltage reaches VGS10t+VGS11t, FETs N10 and N11 turn "on", pulling the input to INV1 LOW. The delay obtained from the circuit 27 is doubled by stacking the FETs N10 and N11 in this way. The FET N11 could be eliminated to yield approximately half the delay produced by this illustrative example.

The input terminal 50 is also connected to the input of an inverter INV2 and the outputs from the inverters INV1 and INV2 are connected to the inputs of a two input NAND gate NAND2, the output of which provides the CONTROL output which is routed to the buffer 28. The CONTROL output is also connected to an inverter INV3 which provides CONTROLB at its output. In summary, when the window comparator detects an intermediate level signal it pulls the input to the inverter INV2 LOW and turns N9 "off". As a result, the current from transistor Q3 charges the capacitor C1 and, after a delay, when the voltage across C1 reaches VGS10t+VGS11t, FETs N10 and N11 turn on, pulling the input to the inverter INV1 LOW. Assuming that the input to the inverter INV1 remains low, the outputs of both inverters will be HIGH and the output of the NAND gate NAND2 will be activated, that is, it will be driven LOW. Using the ratioed transistors Q2 and Q3 and requiring that the capacitor voltage reach VGS10t+VGS11t before the input to INV1 goes low, creates a situation where a very low-level current must charge a capacitor to a relatively high level. This, in turn, permits the use of a relatively small capacitor in creating a relatively long time delay, e.g., approximately 0.5 msec. in the preferred embodiment.

The new three-state input stage 10 may be employed to reduce an electronic system's power consumption. The input stage 10 is particularly suited to applications where integrated circuits are pinout-limited and would otherwise be incapable of providing a "hardware reduced-power function". For example, when included within a pinout-limited IC, the new input stage could be connected to an input pin, such as a data input, which would normally be driven by a three-state output device. In such an application, whenever the three state output device is "floated" for a predetermined period of time, the new input stage's binary decoded outputs activate a reduced power consumption state for the IC.

Figure 5:
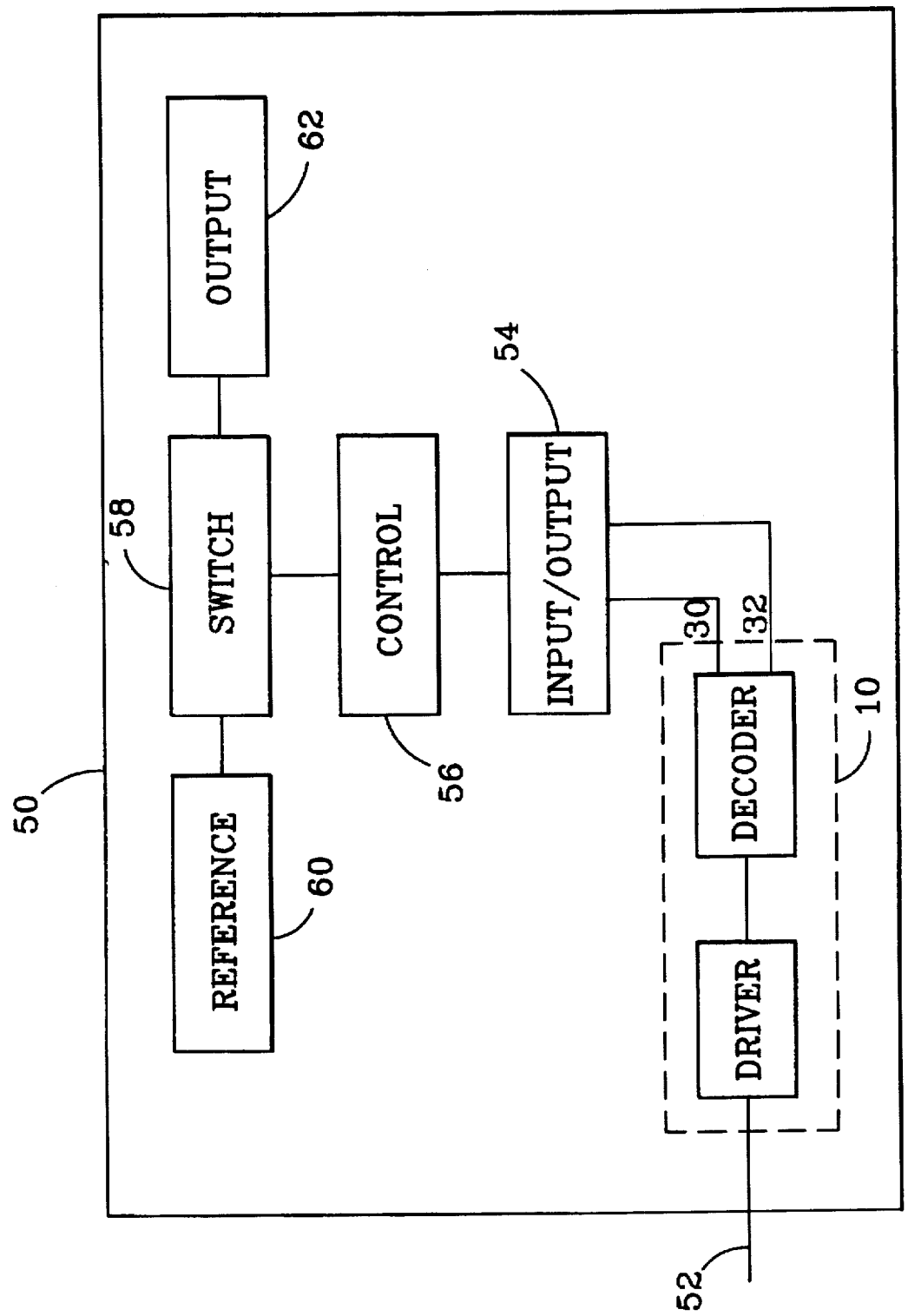
FIG. 5 is a block diagram of a digital to analog converter which uses the new three state input as a reduced power input in combination with a control input.

The block diagram of FIG. 5 illustrates one example of such a reduced power application. In this example a pinout-limited integrated circuit DAC 50, employs the new input stage 10 at the interface to an input pin 52 which acts as a serial data input, and a hardware reduced power input. The DAC block diagram of FIG. 5 is applicable to both voltage output and current output DACs. It includes a controller 56 with a digital input/output (I/O) section 54 through which the controller 56 accepts data and command information.

The controller 56 adjusts switches within a switching section 58 to link a reference section 60 to an output section 62 in response to commands received through the digital I/O section 54. The reference section 60 provides stable, accurate voltage or current references, portions of which are summed in the output section 62 to provide an "analog" output. The magnitude of the analog output is determined by the switching section 58 which determines what portion of the references are summed in the output section 62. That is, the analog output corresponds to the combinatorial value of the digital input. For example, a binary digital value of 11111111 within the controller 56 may adjust the switches within the switching section 58 to produce the highest analog output possible from the DAC, and a digital value of 00000000 may produce the lowest output available. The controller 56 also adjusts the switching section 58 to reduce power consumption in response to activation of a CONTROL signal 32. The CONTROL input 32, when activated, initiates a power-saving mode of operation within the DAC which opens all of the switches in the switching section 58, thereby significantly reducing power consumption without depriving the DAC of power or of the operability of its controller 56.

The new input stage 10 detects any one of three input states, HIGH, LOW, or INTERMEDIATE and decodes them as a two-bit binary output available at pins 30 and 32, as previously described in relation to FIGS. 2 and 3. The two-bit binary output includes input DATA on pin 30 and a reduced power signal CONTROL on pin 32. These signals are conveyed to the input/output subsystem 54, where the data may be routed to registers within the controller 56, for example. As will be explained in greater detail in relation to FIG. 6, the DAC 50 switches currents from the reference circuit to a selected portion of the output section 62, thus producing an output which is proportional to digital values that control the configuration of the switches within the switching section 58. The new input stage 10, by implementing a reduced power input, permits the opening of the switches 58 to substantially reduce power consumption within the IC.

Electronics systems benefit in many ways from reduced power consumption: lower operating costs, greater reliability, and the possible elimination of cooling elements such as fans, to name just a few. Reduced power consumption is particularly critical in battery-powered electronics systems. Not only does a battery-powered system benefit in all the ways just listed, reduced power consumption implies greater operating life between charges for a given battery size or, equivalently, a smaller battery may be used to obtain the same operating life between charges. The bulk and weight of a portable electronics system are severely constrained by the enduser's willingness to carry the system around. Contrast, for example, the lack of acceptance of "luggable" portable computers which were available in the mid- to late-nineteen eighties, to the much greater popularity of lightweight "notebook" computers.

Similarly, extended operating life and small, lightweight packages contribute to the increased popularity of a wide variety of portable electronic processing devices such as cellular telephones, hand-held computers, data loggers, etc. Reduced power consumption plays an important role in reducing the size and weight and thereby increasing the acceptance of such systems.

One approach to power reduction takes advantage of the widespread migration from TTL to CMOS integrated circuit technologies. Unlike TTL logic gates, CMOS gates dissipate very little power when they are in one logic state or the other; they dissipate power primarily when switching from one state to the other. Therefore, to reduce power consumption in CMOS circuits, switching speeds are reduced as much as design constraints will allow. An extreme form of this approach is evidenced by CMOS circuits such as B microprocessors which feature "sleep" modes. In sleep mode, the system clock is shut off for whole sections of circuitry; no switching takes place and power consumption is reduced to almost nothing in that section of circuitry.

One advantage of the "sleep mode" approach over that of power cycling is that, because the power remains applied to the circuit, non-volatile storage is not required. As long as power is applied to the circuit, data, register values, and instructions will remain intact. For a discussion of low-power design techniques see Paul Horowitz, Winfield Hill, *The Art of Electronics*, Second Edition, Cambridge University Press, New York, 1991 at pages 917–985 (sleep mode operation is discussed on page 975 and power switching is described on page 938).

Unfortunately, some circuits are not amenable to either power cycling or sleep mode operation. For example, an R2R DAC, e.g. the DAC 50 of FIG. 5, switchably connects output and reference circuit sections through an resistor array. A voltage output DAC connects each input node of an R2R resistor ladder through analog switches to one of two voltage references; a current output DAC basically reverses the current flow, but both the voltage output and current output DACs would continue to dissipate power through their reference/resistor ladder circuitry even if their digital circuitry were "sleeping", i.e. not changing states. The DAC8800 is an example of a prior art voltage output DAC, the AD7541 is an example of a prior art current output DAC; both are available from Analog Devices, Inc., Norwood, Mass.

The power cycling approach to power conservation meets with its own problems when applied to R2R DACs. The DACs typically include an interface section through which data is loaded into the registers which control the DAC's switch configuration. As noted above, the registers must either be preserved or reloaded when power is restored after a "reduced power" cycle. Reloading the registers can be a time-consuming operation, especially if there are several registers and if the interface is a serial interface. Preserving the registers through the use of nonvolatile storage is often impractical for the reasons noted above.

Figure 6:
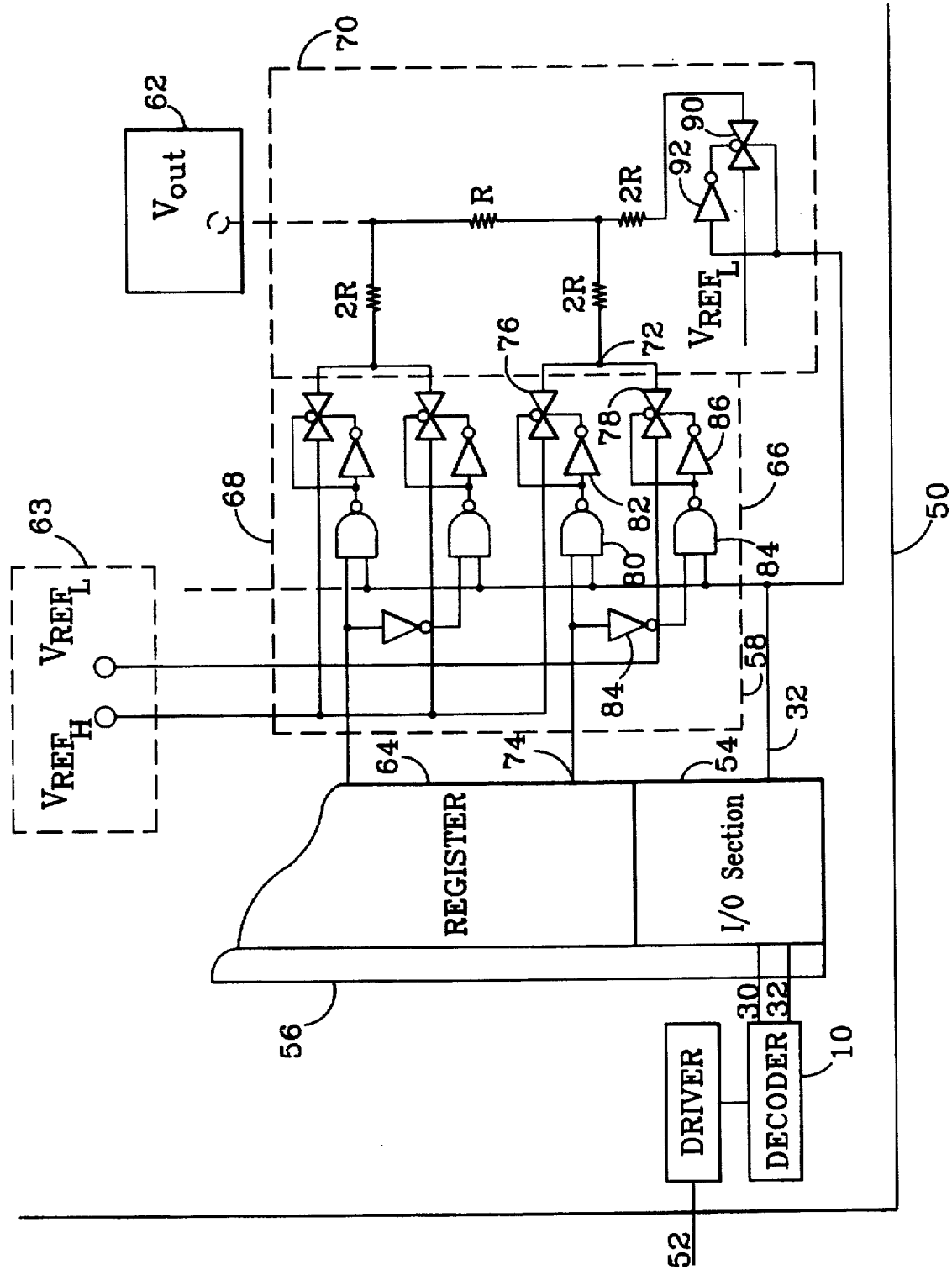
FIG. 6 is a schematic diagram of a current output digital to analog converter which employs the new three state input pin in combination with a control input.

FIG. 6 illustrates a pinout-limited voltage output DAC which incorporates the new three state input stage to provide a logic input and a control input on the same integrated circuit pin. An I/O section 54 of a controller 56 loads registers 64, according to commands received through a serial input 52. Outputs from the registers 64 control the configuration of the switch groups 66, 68, etc., which comprise the switching section 58. In this way, the controller 56 controls the connections between the voltage references $V_{refH}$ and $V_{refL}$ and an output block 18.

The output section 62 consists of an R2R ladder 70, each input node of which is conventionally connected through the switching section 58 to either $V_{refH}$ and $V_{refL}$. Typical values for $V_{refH}$ and $V_{refL}$ are 5V and 0V, respectively. The DAC's analog output voltage $V_{out}$ is highest with all the input nodes connected to the high reference $V_{refH}$, lowest with all the input nodes connected to the low reference $V_{refL}$, and takes on intermediate values corresponding to the values of the binary combinations stored within the registers 64. For a discussion of R2R ladders and their application to DACs, see Paul Horowitz, Winfield Hill, *The Art of Electronics*, Second Edition, Cambridge University Press, New York, 1991, pp 614–616.

A detailed discussion of the switch group 66, which connects input node 72 of the output section 62 to the reference section 63, will serve to explain the detailed operation of this embodiment of the invention. The register output 74 is the least significant bit of the DAC. The switch group 66 includes two analog switches 76 and 78 which are disposed between $V_{refH}$ and the input node and $V_{refL}$ and the input node 72, respectively. In the active mode (with CONTROL input 32 at a logic HIGH level) one and only one of the analog switches 76 and 78 within the switch group 66 is turned on at a time. In this way, the input node 72 is connected to either $V_{refH}$ or $V_{refL}$.

An analog switch is, basically, a four port device. Two of the ports are dedicated to control; each switch features an active LOW and an active HIGH control input. When a logic LOW value is applied to a switch's LOW input control and a logic HIGH is applied to its HIGH input control, an analog switch provides a bidirectional low impedance path for analog signals between its remaining two ports. Analog switches are known in the art, see Paul Horowitz, Winfield Hill, *The Art of Electronics*, Second Edition, Cambridge University Press, New York, 1991, pp 142–143.

The active LOW control input of analog switch 76 is connected to the output of a NAND gate 80 which has as its inputs the register output 74 and the CONTROL signal 32. If both the inputs to the NAND gate 80 are HIGH its output is low, as is the active LOW control input to the analog switch 76. The output of the NAND gate 80 is also connected to the input of an inverter 82, the output of which is connected to the active HIGH input of the analog switch 76. Thus, when either input of the NAND gate 80 is low, the active LOW input of the analog switch 76 is HIGH and the active HIGH input of the analog switch 76 is LOW and, consequently, the analog switch is in a high impedance state. Conversely, when both inputs of the NAND gate 80 are HIGH, the analog switch 76 provides a low impedance path between $V_{refH}$ and the node 72.

Similarly, the active LOW control input of the analog switch 78 is connected to the output of a NAND gate 84, its active HIGH control input is connected through an inverter 86 to the output of the same NAND gate. The inputs to the NAND gate 84 are the CONTROL signal and the register output 74 which has been inverted by an inverter 88.

For example, if the register output 74 is HIGH, the output of the NAND gate 80 is LOW, as is the active LOW control input of the analog switch 76. The inverter 82 inverts the output of the NAND gate 80; the active high input of the analog switch is therefore HIGH and the analog switch 76 is "ON", thereby providing a low-impedance path between $V_{refH}$ and the input node 72. Similarly, because the register output 74 is HIGH, the inverter 88 inverts the input to the NAND gate 84, the output of which is therefore HIGH, as is the active low input to the analog switch 78. The inverter 86 inverts the output from NAND gate 84, presenting a LOW to the active high analog switch 78 input and the analog switch 78 is "OFF", thereby opening the circuit between $V_{refL}$ and the input node 72.

Assume now that the register output 74 is LOW. The output of NAND gate 80 is HIGH, as is the active low input to the analog switch 76, and the inverter 82 provides a LOW input to the active high input of the analog switch 76. The analog switch 76 is therefore "OFF" and the path between the reference $V_{refH}$ and the input node 72 is open. Since the inverter 88 provides a HIGH input to the NAND gate 84, the output of the NAND gate 84 is LOW, as is the active low input to the analog switch 78, and the inverter 86 provides a HIGH input to the active high input of the analog switch 78. The analog switch 78 is therefore "ON" and provides a low impedance path between the reference $V_{refL}$ and the input node 72.

In the active mode, i.e. when the CONTROL input 32 is HIGH, there is thus always one switch in each switch group that is "ON" and provides a low impedance path between a reference and an input node.

In the reduced power mode, on the other hand, the CONTROL input 32, which is distributed to the NAND gates 80, 84, is LOW. Consequently the output of each NAND gate 80, 84 is HIGH, as is the input to the active low input of each analog switch 76, 78. Furthermore, because of the inverters 82, 86 the active HIGH input of each of the analog switches 76,78 is LOW. Thus, whenever the CONTROL input is LOW, both the analog switches 76, 78 are "OFF", the paths from both reference voltages to the input node 72 is open, and no current flows between the reference section 63 and the output section 62. In this way, all of the switch groups 66, 68 . . . in the switching section 58, one for each register bit, are placed in the high impedance state by one CONTROL signal 32. Additionally, an analog switch 90 connects the "bottom" of the R2R ladder 70 to $V_{refL}$ and is placed in a high impedance state by the activation of the CONTROL signal. That is, the active LOW control input of the switch 90 is connected through an inverter 92 to the CONTROL signal, and the active HIGH input of the switch 90 is connected directly to the CONTROL signal.

As indicated above, in the reduced power mode, although the reference/output circuitry power consumption is greatly reduced, the registers 64 remain in operation. They may retain their contents without reloading, which may be of great benefit if there are several DACs located on a single integrated circuit. Alternatively, they may be reloaded while the DACs are in the reduced power mode, permitting a sort of "pipelining" of DAC operation whereby an analog output is produced and, rather than waiting for reactivation of the output block, the registers 64 are reloaded in anticipation of the next-required analog output.

A current output DAC operates in much the same manner as the voltage output DAC. The switch groups 66, 68 . . . , registers 64, I/O 12, switch 90 and R2R ladder 70 are identical. However, a single reference voltage $V_{ref}$ supplies an input to the R2R ladder 70 and current flows from the R2R ladder into one of two current outputs $out_1$ or $out_2$, under control of the switch groups 66, 68 et al. The output and reference sections 18 and 16 are basically reversed. As with the voltage output DAC, the CONTROL signal "opens" all the switches in the switch group, thereby significantly reducing current flow between the output and reference sections. In the current output implementation analog switch 90 imposes a high impedance path between $out_1$ and the "bottom" of the R2R ladder 70 when it is "opened" by activation of the CONTROL input 32. The new three-state input may be employed by either current output or voltage output DACs in a reduced power application as just described or to effectively increase the device's pinout in order to incorporate further operations.

The forgoing description of specific embodiments of the invention has been presented for the purposes of illustration and description. It is not intended to be exhaustive or to limit the invention to the precise forms disclosed, and many modifications and variations are possible in light of the above teachings. For example, the new input stage may be employed by an analog to digital converter, or any microprocessor peripheral IC. Additionally, the passive driver needn't be composed entirely of passive circuit elements. Although the emitter areas of transistors Q2 and Q3 are ratioed ten to one in the preferred embodiment, to permit the use of a conveniently-sized resistor R6 for a given time constant, the emitter areas may be implemented using any appropriate ratio. The embodiments were chosen and described in order to best explain the principles of the invention and its practical application, to thereby enable others skilled in the art to best utilize the invention. It is intended that the scope of the invention be limited only by the claims appended hereto.

We claim:

1. A three-state input device for conversion of signals from output devices which provide three output states, i.e., a low impedance path from their output terminal to a positive supply, a low impedance path from their output terminal to a negative supply or a high impedance paths from their output terminal to both supplies, comprising:

a driver connected to an input terminal which provides a path to the output device's output terminals, said driver also connected to positive and negative supply lines, and to produce, at an output, predetermined logic levels, each logic level corresponding to one of the three impedance paths presented by said output device.

2. The three-state input device of claim 1, wherein said driver comprises a resistor divider connected between said positive and negative supply lines, said divider having a tap connected to the input terminal, with the resistors of the divider ratioed to produce an intermediate voltage at the divider tap when the impedance path from the tap through the output device to either supply is a high impedance path.

3. The three-state input device of claim 2, further comprising:

a ternary-to-binary decoder connected to receive said driver output and to provide binary outputs corresponding to three logic level outputs available from said driver.

4. The three-state input device of claim 2, further comprising:

a window detector connected to receive said driver output, to detect an intermediate level signal at said driver output, and to produce a detector output indicative of the presence or absence of an intermediate level signal at said detector input.

5. The three-state input device of claim 4, further comprising:

a delay circuit connected to said window detector and responsive to the detection of an intermediate level signal by said detector, said delay circuit providing a control output for use by a power reduction circuit which is responsive to the sustained detection of said intermediate level signal.

6. The three-state input device of claim 5, further including a buffer having a logic input, a logic output, and a control input, said buffer connected at its logic input to receive said driver output and at its control input to receive said delay circuit control output, said logic output providing logic level output signals in response to signals appearing at said logic input but also being responsive to activation of said control input by entering a high impedance state.

7. The three-state input device of claim 6, further including a driver connected to receive said delay circuit control output and to drive said buffer output to a predetermined logic level in response to activation of said control output.

8. A power reduction circuit for use with output devices which provide three output states, i.e., a low impedance path from their output terminal to a positive supply, a low impedance path from their output termnial to a negative supply or a high impedance paths from their output terminal to both supplies, comprising:

circuitry connected to operate in a reduced power consumption mode in response to activation of a power control input, and a three-state input device having one logic input and two logic outputs, said input device being connectable at said logic input to receive a three state output signal and at one of said logic outputs to activate said power control input in response to one of three logic states detected at said logic input.

9. The power reduction circuit of claim 8, wherein said three state input device comprises:

a driver connected to an input terminal which provides a path to the output device's output terminal, said driver also connected to positive and negative supply lines, and to produce, at an output, predetermined logic levels, each logic level corresponding to one of the three impedance paths presented by said output device.

10. The power reduction circuit of claim 9, wherein said driver comprises a resistor divider connected between said positive and negative supply lines, said divider having a tap connected to the input terminal, with the resistors of the divider ratioed to produce an intermediate voltage at the divider tap when the impedance path from the tap through the output device to either supply is a high impedance path.

11. The power reduction circuit of claim 9, wherein said three state input device further comprises:

a ternary-to-binary decoder connected to receive said driver output and to provide binary outputs corresponding to three logic level outputs available from said driver.

12. The power reduction circuit of claim 11, wherein said three state input device further comprises:

a window detector connected to receive said driver output, to detect an intermediate level signal at said driver output, and to produce a detector output indicative of the presence or absence of an intermediate level signal at said detector input, and a delay circuit connected to said window detector and responsive to the detection of an intermediate level signal by said detector, said delay circuit providing a control output for use by a power reduction circuit which is responsive to the sustained detection of said intermediate level signal, a buffer having a logic input, a logic output, and a control input, said buffer connected at its logic input to receive said driver output and at its control input to receive said delay circuit control output, said logic output providing logic level output signals in response to signals appearing at said logic input but also being responsive to activation of said control input by entering a high impedance state, and a driver connected to receive said delay circuit control output and to drive said buffer output to a predetermined logic level in response to activation of said control output.

13. The power reduction circuit of claim 12 further comprising a control switch connected at two terminals between a power supply and said circuitry connected to operate in a reduced power consumption mode and at a control terminal to said power control input, said switch producing a high impedance path between said power supply and said circuitry connected to operate in a reduced power mode in response to activation of said power control input.

14. A low power digital to analog converter connectable to a voltage reference circuit and including a three-state input device for conversion of signals from output devices which provide three output states, i.e., a low impedance path from their output terminal to a positive supply, a low impedance path from their output terminal to a negative supply or a high impedance path from their output terminal to both supplies, comprising:

an output circuit which provides an analog output signal, a switch circuit which selectively connects said reference circuit to said output circuit under control of a switch control circuit, said switch control circuit controlling the interconnection of said reference and output circuits in combinatorial correspondence with digital values stored within said control circuit, and a three state input device, comprising a driver connected to an input terminal which provides a path to the output device's output terminals, said driver also connected to positive and negative supply lines, and to produce, at an output, predetermined logic levels, each logic level corresponding to one of the three impedance paths presented by said output device.

15. The low power digital to analog converter of claim 14, wherein the switch circuit comprises CMOS analog switch groups.

16. The low power digital to analog converter of claim 15, wherein said driver comprises a resistor divider connected between said positive and negative supply lines, said divider having a tap connected to the input terminal, with the resistors of the divider ratioed to produce an intermediate voltage at the divider tap when the impedance path from the tap through the output device to either supply is a high impedance path.

17. The low power digital to analog converter of claim 16, wherein said three state input device further comprises:

a ternary-to-binary decoder connected to receive said driver output and to provide binary outputs corresponding to three logic level outputs available from said driver.

18. The low power digital to analog converter of claim 17, wherein said three state input device further comprises:

a window detector connected to receive said driver output, to detect an intermediate level signal at said driver output, and to produce a detector output indicative of the presence or absence of an intermediate level signal at said detector input, and a delay circuit connected to said window detector and responsive to the detection of an intermediate level signal by said detector, said delay circuit providing a control output for use by a power reduction circuit which is responsive to the sustained detection of said intermediate level signal, a buffer having a logic input, a logic output, and a control input, said buffer connected at its logic input to receive said driver output and at its control input to receive said delay circuit control output, said logic output providing logic level output signals in response to signals appearing at said logic input but also being responsive to activation of said control input by entering a high impedance state, and a driver connected to receive said delay circuit control output and to drive said buffer output to a predetermined logic level in response to activation of said control output.

* * * * *